(12) United States Patent
Sharpe-Geisler et al.

(10) Patent No.: US 9,543,950 B2
(45) Date of Patent: Jan. 10, 2017

(54) HIGH SPEED COMPLEMENTARY NMOS LUT LOGIC

(71) Applicant: Lattice Semiconductor Corporation, Hillsboro, OR (US)

(72) Inventors: Brad Sharpe-Geisler, San Jose, CA (US); Senani Gunaratna, Los Gatos, CA (US); Ting Yew, San Jose, CA (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 0 days.

(21) Appl. No.: 14/611,069

(22) Filed: Jan. 30, 2015

(65) Prior Publication Data

US 2016/0020767 A1    Jan. 21, 2016

Related U.S. Application Data

(60) Provisional application No. 62/026,857, filed on Jul. 21, 2014.

(51) Int. Cl.
*H03K 19/00* (2006.01)
*H03K 19/177* (2006.01)
*H03K 19/0948* (2006.01)

(52) U.S. Cl.
CPC ...... *H03K 19/0013* (2013.01); *H03K 19/0948* (2013.01); *H03K 19/177* (2013.01)

(58) Field of Classification Search
CPC ............ H03K 19/0013; H03K 19/0948; H03K 19/177
USPC .......................................................... 326/41
See application file for complete search history.

(56) References Cited

U.S. PATENT DOCUMENTS

| 5,166,547 | A | 11/1992 | Babakanian et al. |
| 5,272,397 | A | 12/1993 | Chen et al. |
| 6,768,338 | B1* | 7/2004 | Young ................ H03K 19/1737 326/113 |
| 6,809,552 | B1 | 10/2004 | Pi et al. |
| 6,956,399 | B1* | 10/2005 | Bauer ............... H03K 19/17728 326/105 |
| 6,992,505 | B1* | 1/2006 | Zhou .................. H03K 19/1733 326/113 |
| 6,998,872 | B1* | 2/2006 | Chirania ............. H03K 19/1736 326/39 |
| 7,061,271 | B1* | 6/2006 | Young ................. G06F 17/5054 326/37 |
| 7,116,131 | B1* | 10/2006 | Chirania .......... H03K 19/17728 326/113 |
| 7,194,501 | B2 | 3/2007 | Dubey et al. |
| 7,385,416 | B1* | 6/2008 | Chirania .......... H03K 19/17728 326/37 |
| 7,800,402 | B1 | 9/2010 | Rahim et al. |

(Continued)

FOREIGN PATENT DOCUMENTS

WO    WO 2013/131765 A1    9/2013

*Primary Examiner* — Dylan White (57) ABSTRACT

A programmable logic is provided that uses only NMOS pass transistors to pass a true output signal to an internal true node and to pass a complement output signal to an internal complement node. The internal true and complement nodes are cross-coupled through PMOS transistors so that the discharge of one of the internal true and complement nodes switches on a corresponding one of the cross-coupled PMOS transistors to charge a remaining one of the internal true and complement nodes.

18 Claims, 5 Drawing Sheets

(56) References Cited

U.S. PATENT DOCUMENTS

| | | | |
|---|---|---|---|
| 8,760,193 B2* | 6/2014 | Voogel | H03K 19/17744 326/38 |
| 2007/0164785 A1 | 7/2007 | He | |
| 2008/0197879 A1 | 8/2008 | Leung | |

* cited by examiner

HIGH SPEED COMPLEMENTARY NMOS LUT LOGIC

RELATED APPLICATIONS

This application claims the benefit of U.S. Provisional Application No. 62/026,857, filed Jul. 21 2014, the contents of which are hereby incorporated by reference in their entirety.

TECHNICAL FIELD

The present invention relates generally to look-up tables for programmable logic devices, and more particularly to high-speed complementary NMOS-based look-up tables for programmable logic devices.

BACKGROUND

Programmable logic devices such as field programmable gate arrays (FPGAs) implement their logic through look-up tables. Each look-up table (LUT) includes a plurality of memory cells such as SRAM cells that store the corresponding truth table. For example, a 16-bit LUT would include 16 memory cells storing a 16-bit truth table. Based upon the input signal to the LUT, one of the values in the truth table is provided as the resulting look-up table logic output signal. To perform the selection of the appropriate value from the truth table responsive to the input signals, a look-up table will typically include a number of pass gates. Each pass gate may be constructed using an NMOS transistor. The resulting LUT may then be designated as an NMOS-based LUT. Alternatively, the pass gates may be implemented using transmission gates. As used herein, LUTs that use transmission gates as the pass gates are denoted as "CMOS-based" LUTs since a transmission gate includes both an NMOS transistor and a PMOS transistor. It is the case, however, that NMOS-based LUTs also include PMOS devices and so they may also be constructed using CMOS process technology. But since the pass gates are not complementary (including both an NMOS as well as a PMOS device) in a NMOS-based LUT, only LUTs having their pass gates implemented as transmission gates are denoted herein as CMOS-based LUTs.

Figure 1A:
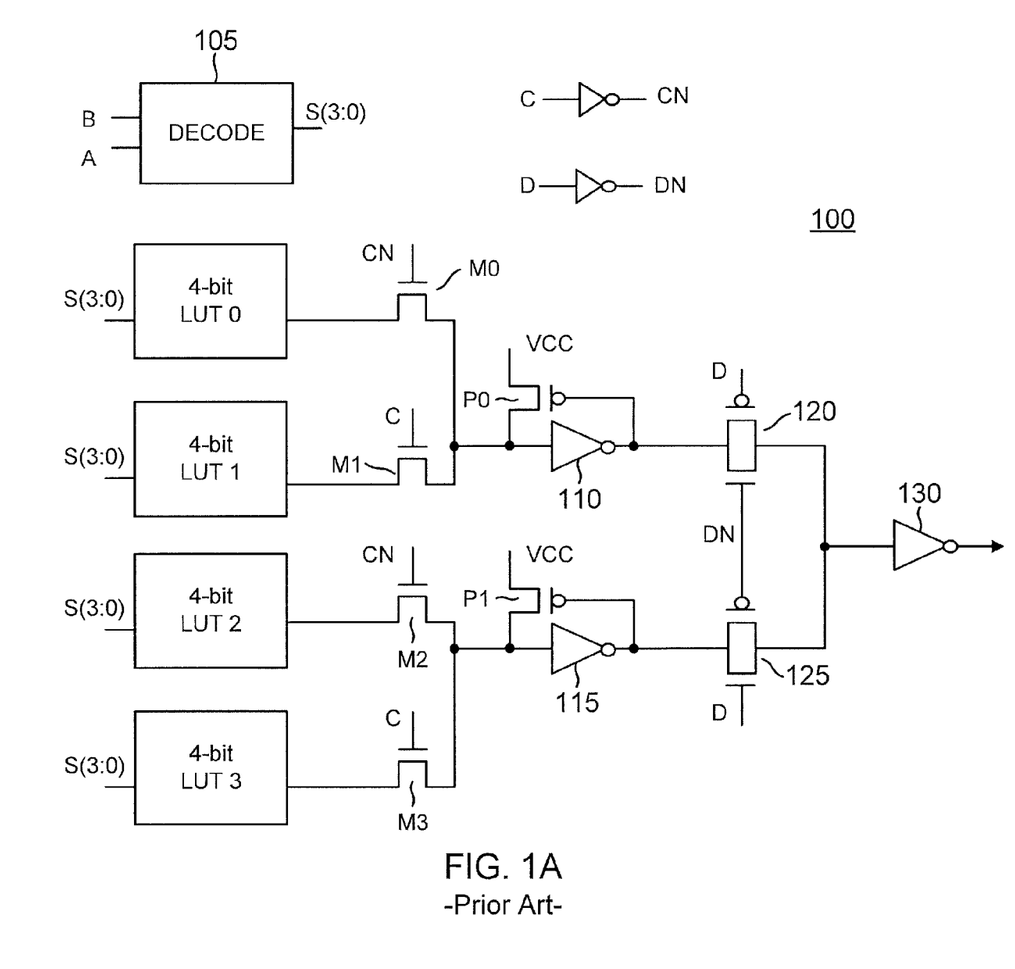
FIG. 1A is a circuit diagram of a conventional NMOS-based LUT.
Figure 1B:
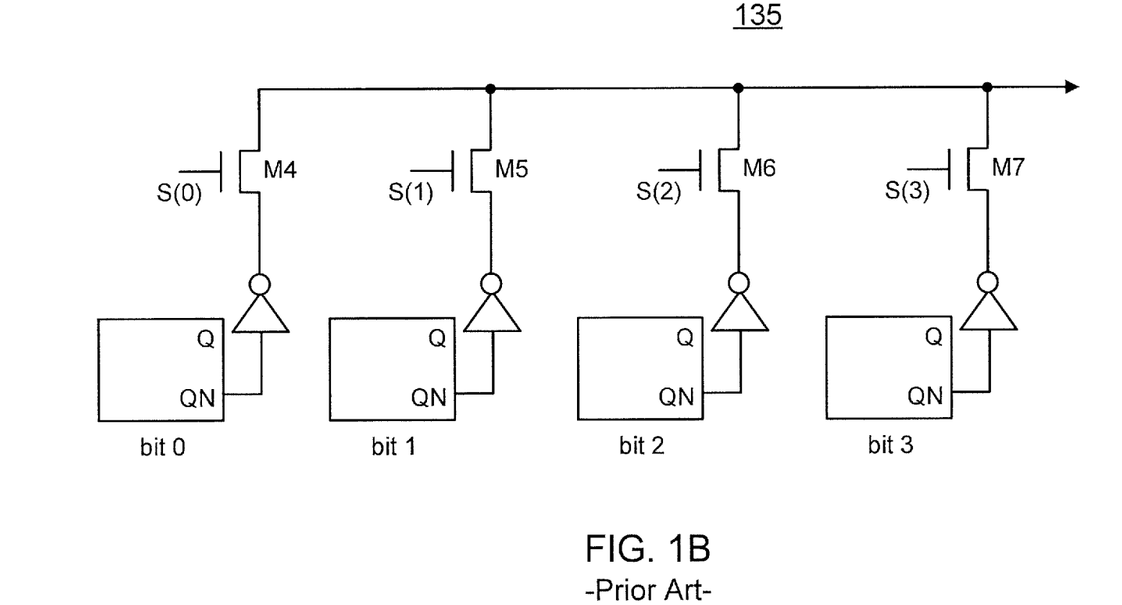
FIG. 1B is a circuit diagram of a four-bit LUT within the LUT of FIG. 1A.

An example 16-bit NMOS-based LUT 100 is shown in FIG. 1A. Signals A, B, C, and D are the input signals to LUT 100. Input signals A and B are decoded by a decoder 105 to produce a four decoded signals S(3:0). The sixteen bits for LUT 100 are split into four 4-bit LUTs, ranging from a LUT0, a LUT1, a LUT2, to a LUT3. The decoded signals S(3:0) are received by the 4-bit LUTs. An example 4-bit LUT 135 is shown in FIG. 1B. The 4 bits are stored in memory cells ranging from a bit 0 cell, a bit 1 cell, a bit 2 cell, to a bit 3 cell. The complement bit value QN for each memory cell is inverted through a corresponding inverter before passing through a corresponding pass transistor. From the decoded signals S(3:0), S(0) drives the gate of an NMOS pass transistor M4 for bit cell 0. Similarly, S(1) drives the gate of an NMOS pass transistor M5 for bit cell 1, S(2) drives the gate of an NMOS pass transistor M6 for bit cell 2, and S(3) drives the gate of an NMOS pass transistor M7 for bit cell 3. Referring again to decoder 105 of FIG. 1A, the two signals A and B may be decoded such that only one of the decoded signals S(3:0) is asserted such that only the corresponding pass transistor M4 through M7 (FIG. 1B) will allow the corresponding bit to pass.

The remaining input signals C and D and their inverted versions CN and DN control which 4-bit LUT output signal can produce the output signal for LUT 100. Inverted control signal CN drives the gate of an NMOS pass transistor M0 to control whether the output of LUT 0 passes to an inverter 110 whereas control signal C drives the gate of an NMOS pass transistor M1 to control whether the output of LUT 1 passes to inverter 110. The same control for whether LUT 2 passes its output signal to an inverter 115 and for whether LUT 3 passes its output signal to inverter 115 exists with regard to NMOS pass transistors M2 and M3. Consider the case as the supply voltage VCC is lowered for more advanced process nodes. Should pass transistors M0 through M3 have to pass a binary one output signal (which should be at the power supply voltage VCC), the resulting passed output signal will be lowered in voltage by the threshold voltage Vt for these pass transistors. For example, if the power supply voltage VCC is 0.9 volts and Vt is 0.45 volts, the resulting passed binary high signal to either inverter 110 and 115 would be only 0.45 volts. For such a relatively low voltage to be detected as a logic high signal, the threshold voltage of the NMOS transistor (not illustrated) in inverters 110 and 115 must be relatively low whereas the PMOS transistor (not illustrated) in these same inverters must have a relatively high threshold voltage. To ensure that the PMOS transistor in each inverter 110 and 115 is fully off with such a weak binary one signal coming from pass transistors M0 through M3, the output of the inverters feeds back through to their inputs through PMOS transistors P0 and P1, respectively. But the low Vt for the NMOS transistors in inverters 110 and 115 then results in these NMOS transistors not fully turning off when the inverters receive logic low (ground) input signals. The result is relatively high static power consumption for an NMOS-based LUT such as LUT 100.

To complete the operation of LUT 100, the output of inverter 110 is gated by a transmission gate 120 having a PMOS side controlled by input signal D and an NMOS side controlled by inverted input signal D. Similarly, the output of inverter 115 is gated by a transmission gate 125 having its PMOS side controlled by inverted input signal DN and its NMOS side controlled by input signal D. Transmission gates 120 and 125 drive an inverter 130 that produces the LUT output signal accordingly. The result is that the four input signals A, B, C, and D select for one of the sixteen truth table bits as would be expected for a sixteen-bit LUT operation.

To lower the static power consumption, pass transistors M0 through M3 in LUT 100 may be replaced with transmission gates as is conventional for a CMOS-based LUT. Inverters 110 and 115 may then use high-VT NMOS transistors, which reduces the static power consumption. But the PMOS transistors in the resulting transmission gates introduce additional capacitance, which lowers operating speeds. In addition, the need for the additional PMOS transistors to construct the resulting transmission gates reduces density as compared to NMOS-based LUTs.

Accordingly, there is a need in the art for an NMOS-based LUT with decreased static power consumption.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

An NMOS-based LUT is provided that has low static power consumption despite the use of NMOS pass transistors. As is conventional, the truth table is instantiated into a plurality of smaller LUTs to construct the resulting NMOS-based LUT. For example, a sixteen-bit LUT may be formed using four 4-bit LUTs. Each smaller LUT is complementary in that, upon selection by the input signals, it passes both a true and complement output signal. Since it is an NMOS-based LUT, the true and complement output signal from the smaller LUTs are gated by corresponding NMOS pass transistors. Such NMOS pass transistors pass strong logic zero (grounded) output signals but pass relatively weak logic one output signals equaling the power supply voltage VCC minus the threshold voltage Vt. As discussed previously, the weak binary one signals passed by NMOS pass transistors cause power consumption issues in conventional NMOS-based LUTs. In contrast, the true and complement output signals from the NMOS-based LUT disclosed herein are cross-coupled through corresponding PMOS transistors having their sources tied to a power supply voltage node supplying the power supply voltage VCC. It thus doesn't matter whether the true or the complement output signal is the low value as whichever is low turns on its cross-coupled PMOS transistor that then charges the remaining output signal to VCC. A single-sided conversion circuit provides additional feedback to assist in the switching of the true output signal, which is then provided as an output from the LUT. Note the advantages of such an NMOS-based LUT—the relative compactness and high-speed of an NMOS-based architecture is retained yet the inverters in the single-sided conversion circuit may have NMOS transistors with relatively high voltage thresholds because robust binary one signals are passed with the assistance of the cross-coupled PMOS transistors. Accordingly, the resulting NMOS-based LUT is compact and high-speed yet has low static power consumption. These advantageous features may be better appreciated with regard to the following example embodiments.

Figure 2A:
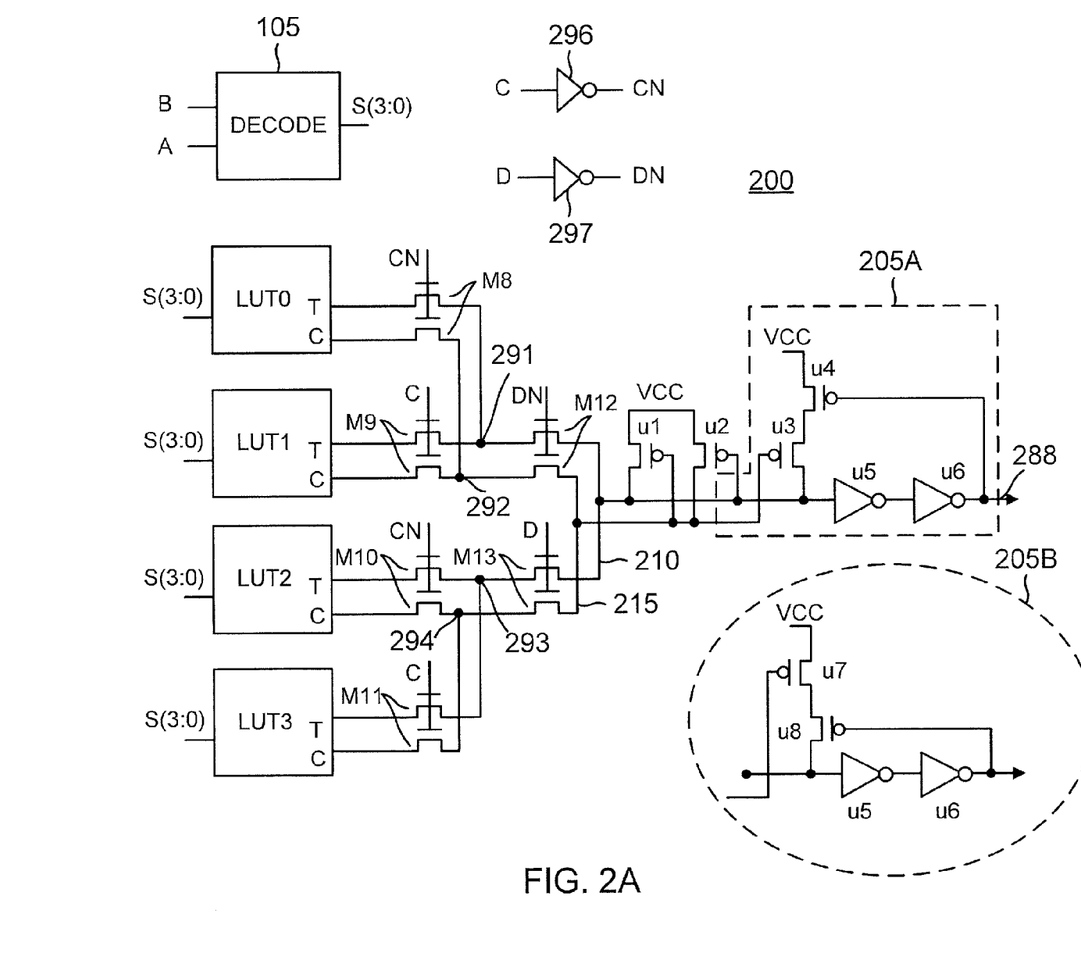
FIG. 2A is a circuit diagram of an NMOS-based LUT in accordance with an embodiment of the invention.

An example NMOS-based LUT 200 with reduced static power consumption and lower density is shown in FIG. 2A. Signals A, B, C, and D are the input signals to LUT 200. Input signals A and B are decoded by a decoder 105 to produce four-bit decoded signals S(3:0). The sixteen bits for LUT 200 are split into four 4-bit LUTs, ranging from a LUT0, a LUT1, a LUT2, to a LUT3. It will be appreciated, however, that the number of bits and the number of LUTS may be varied in alternative embodiments. The decoded signals S(3:0) are the input signal to each 4-bit LUT.

Figure 2B:
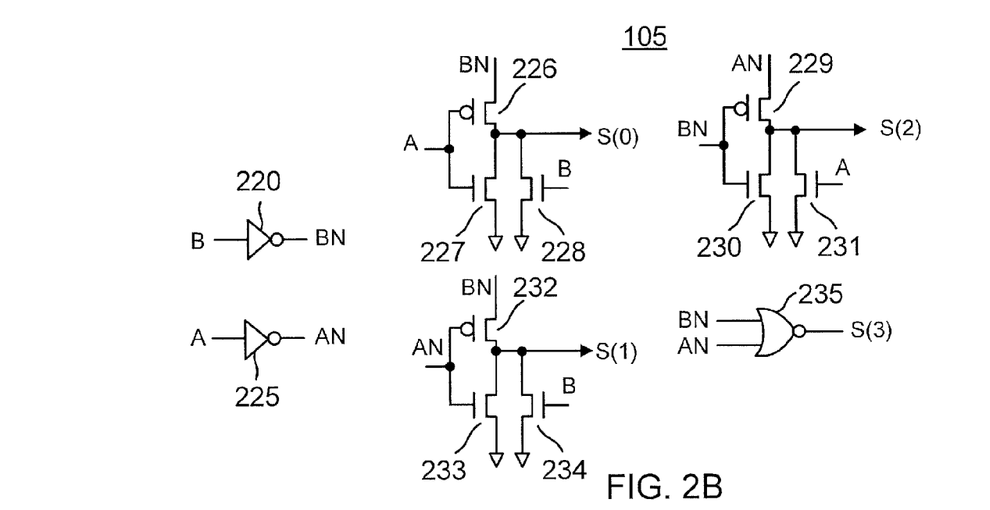
FIG. 2B is a circuit diagram of a decoder for the NMOS-based LUT of FIG. 2A.

Decoder 105 is shown in more detail in FIG. 2B. An inverter 220 inverts input signal B to produce complement input signal BN. Similarly, an inverter 225 inverts input signal A to produce complement input signal AN. To produce decoded output signal S(0), input signal A drives the gate of a PMOS transistor 226 in series with an NMOS transistor 227. The source of PMOS transistor 226 is tied to complement input signal BN whereas the source of NMOS transistor 227 is tied to ground. An NMOS transistor 228 couples between ground and the drains of transistors 226 and 227. Input signal B drives the gate of NMOS transistor 228. The drains of transistors 226 and 227 are also the output node for decoded signal S(0). If input signal B is high, decoded signal S(0) will be low regardless of the value of input signal A because transistor 228 will be switched on. If input signal B is low, transistors 226 and 227 function as an inverter to invert input signal A such that decoded signal S(0) will then equal complement input signal AN.

An analogous collection of a PMOS transistor 232, an NMOS transistor 233 and an NMOS transistor 234 provides decoded signal S(1). In this case, the only difference from transistors 226, 227, and 228 is that the complement input signal AN drives the gates of transistors 232 and 233. Thus, if input signal B is low, decoded signal S(1) equals the input signal A. If input signal B is high, decoded signal S(1) is grounded.

Another analogous collection of a PMOS transistor 229, an NMOS transistor 230, and an NMOS transistor 231 provides decoded signal S(2) Complement input signal BN drives the gate of transistors 229 and 230. The source of PMOS transistor 229 is tied to complement input signal AN whereas input signal A drives the gate of NMOS transistor 231. When input signal A is high, decoded signal S(2) will thus be low. When input signal A is low, decoded signal S(2) will equal input signal B. Finally, a NOR gate 235 NORs complement input signals AN and BN to produce decoded signal S(3). The net result is that input signals A and B are decoded such that only one of the decoded signals S(0) through S(3) is asserted for any combination of input signals A and B.

Figure 2C:
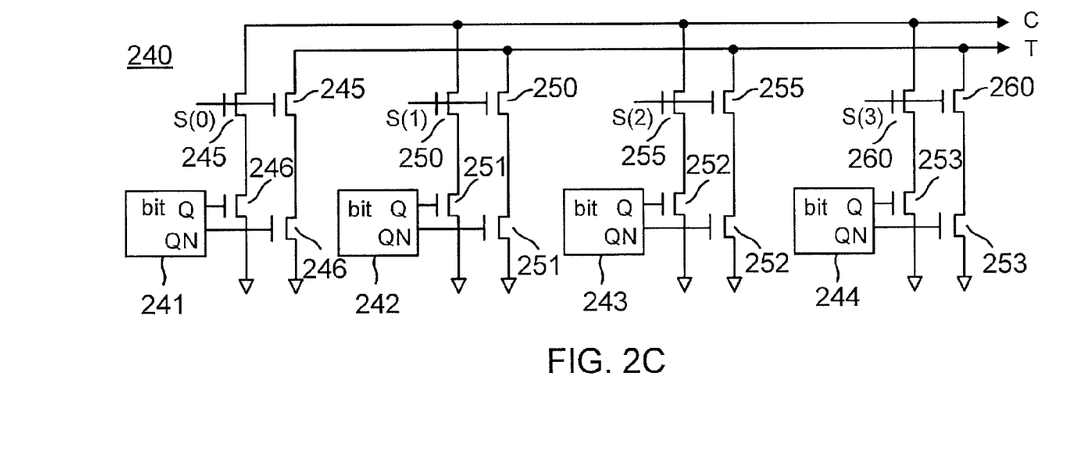
FIG. 2C is a circuit diagram of a four-bit LUT within the LUT of FIG. 2B.

An example 4-bit LUT 240 is shown in FIG. 2C. The four truth table bits are stored in corresponding memory cells ranging from a bit 0 cell 241, a bit 1 cell 242, a bit 2 cell 243, to a bit 3 cell 244. The true (Q) and complement (QN) bit values from each memory cell drive the gate of a first pair of NMOS transistors having their sources coupled to ground. For example, the Q and QN output signals from bit 0 cell 241 drives the gates of corresponding NMOS transistors 246. Similarly, the Q and QN output signals from bit 1 cell 242 drive the gates of NMOS transistors 251, the Q and QN output signals from bit 2 cell 243 drive the gates of NMOS transistors 252, and the Q and QN output signals from bit 3 cell 244 drive the gates of NMOS transistors 253. A second pair of NMOS transistors couple between the drains of the first pair of NMOS transistors for each bit cell and the true (T) and complement (C) output nodes. These second pairs of NMOS transistors have their gates controlled by the decoded signals. For example, decoded signal S(0) controls whether a pair of transistors 245 allow the Q and QN signals from bit 0 cell 241 to ground a true T or a complement C output node. Note that the Q and QN signals do not pass directly as they control the gates of transistors 246. Thus, suppose that decoded signal S(0) is asserted such that transistors 245 are conducting. If the Q output from memory cell 241 is high, the complement output node C will then be discharged to ground. In that case, the QN output from memory cell 241 would be low such that the true output node T floats. Conversely, if the QN output signal is high, the true output node T is discharged while the complement output node C floats.

The remaining memory cells are controlled in an analogous fashion. For example, decoded signal S(1) controls whether an NMOS pair of transistors 250 allow either of transistors 251 to ground one of the true and complement output nodes as determined by the Q and QN output signals from bit 1 cell 242. Similarly, decoded signal S(2) controls NMOS transistors 255 for bit 2 cell 243 whereas decoded signal S(3) controls NMOS transistors 260 for bit 3 cell 244.

Referring again to FIG. 2A, the input signals C and D are inverted by corresponding inverters 296 and 297 to provide complement input signals CN and DN, respectively. Complement input signal CN drives the gates for a pair of NMOS pass transistors M8 to control whether the true and complement outputs from LUT 0 can pass to an intermediate true node 291 and an intermediate complement node 292, respectively. Input signal C drive the gates for a pair of NMOS pass transistors M9 to control whether the true and complement outputs from LUT 1 can pass to the same intermediate true and complement nodes 291 and 292, respectively. Complement input signal DN drives the gates for a pair of NMOS pass transistors M12 to control the coupling of intermediate true and complement nodes 291 and 292 to an internal true and complement node 210 and 215, respectively.

The coupling of the true and complement outputs from LUT 2 and LUT 3 to internal nodes 210 and 215 is analogous. Complement input signal CN drives the gates for a pair of NMOS pass transistors M10 to control whether the true and complement outputs from LUT 2 can pass to an intermediate true node 293 and an intermediate complement nodes 294, respectively. Input signals C drives the gates for a pair of NMOS pass transistors M11 to control whether the true and complement outputs from LUT 3 can pass to these same intermediate true and complement nodes 293 and 294, respectively. Input signal D drives the gates of a pair of NMOS transistors M13 to control the coupling of intermediate true and complement nodes 293 and 294 to internal true and complement nodes 210 and 215, respectively.

As discussed previously with regard to FIG. 2C, the memory cells in the LUTs can only ground their LUT true or complement output nodes and cannot charge either of these nodes to the power supply voltage VCC. For this reason, the QN output from each memory cell controls whether the corresponding LUT true output is grounded (if the corresponding decoded S signal is asserted high) as the true output node should be low if the QN output is high. Similarly, the Q output from each memory cell controls whether the corresponding LUT complement output node is grounded (if the corresponding decoded S signal is asserted high) as the complement output node should be grounded if the true output should be high. But the memory cell cannot drive out a logic one to then drive the appropriate LUT output high.

To assist in charging the appropriate internal node 215 and 210 to the power supply voltage VCC, each node drives the gate of a cross-coupled PMOS transistor. For example, internal true node 210 couples to the gate of a cross-coupled PMOS transistor U2 having a source tied to a power supply node supplying the power supply voltage VCC and having a drain cross-coupled to internal complement node 215. If internal true node 210 is discharged by one of the LUT memory cells as discussed above, cross-coupled PMOS transistor U2 will thus switch on to charge internal complement node 215 to VCC. Similarly, internal complement node 215 couples to the gate of a cross-coupled PMOS transistor U1 having its source tied to the power supply node and its drain cross-coupled to internal true node 210. When internal complement node 215 is discharged by one of the LUT memory cells as discussed above, cross-coupled PMOS transistor U1 is switched on to charge internal true node to VCC.

Suppose that internal true node 210 had been discharged and internal complement node 215 had been charged to VCC. If the input signals change state such that internal true node 210 is to be charged to VCC and internal complement node 210 discharged, note that the LUT memory cells cannot affirmatively charge either of the internal nodes. Instead, internal true node 210 will simply float with respect to the LUT memory cells. Since its initial state was discharged, such floating causes internal true node 210 to remain at ground, resulting in a discharge/charge battle as cross-coupled PMOS transistor U2 would then fight with whatever LUT memory cell that is functioning to discharge internal complement node 215.

To speed up the switching of the states for internal nodes 215 and 210, a feedback circuit 205A is provided that also provides the differential-to-single-sided conversion from complementary internal nodes 215 and 210 to a single-sided LUT output signal node 288. Feedback circuit 205A includes a serial pair of inverters U5 and U6 coupled between true internal node 210 and LUT output signal node 288. LUT output signal node 288 also couples to a gate of a PMOS transistor U4 having its source coupled to a VCC power supply node and a drain coupled to the source of a PMOS transistor U3 that in turn has its drain coupled to internal true node 210 and its gate coupled to internal complement node 215. To increase operation speed, the combination of PMOS transistors U4 and U3 in parallel with cross-coupled PMOS transistor U1 should be stronger than cross-coupled PMOS transistor U2 that in turn should be stronger than cross-coupled PMOS transistor U1. These relative transistor strengths advantageously increase operating speed as follows. For example if internal complement mode 215 had been charged high to VCC, PMOS transistor U3 will be off. At the same time, internal true node 210 will have been discharged such that PMOS transistor U4 will be on. When internal complement node 215 is then discharged, PMOS transistor U3 will switch on. Since PMOS transistor U4 was already on, the relative strength in combination of PMOS transistors U3 and U1 will quickly charge internal true node 210 high. The charged state for internal true node 210 then propagates through inverters U5 and U6 to switch off PMOS transistor U4. At that point, it is just cross-coupled PMOS transistor U1 that maintains the charge on internal true node 210. If the LUT memory cells are then driven to discharge internal true node 210, such a discharge can occur relatively quickly due to the relative weakness of cross-coupled PMOS transistor U1.

An alternative embodiment for a feedback circuit is shown in FIG. 2C as feedback circuit 205B. Inverters U5 and U6 are arranged in series between internal true node 210 and LUT output signal node 288 as discussed with regard to feedback circuit 205A. In feedback circuit 205B, however, LUT output signal node 288 couples to the gate of a PMOS transistor U8 having its drain coupled to internal true node 210 and its source coupled to the drain of a PMOS transistor U7. Internal complement node 215 couples to the gate of PMOS transistor U7, which has its source coupled to the VCC power supply node. If the internal true node 210 had been low, PMOS transistor U8 will be on but PMOS transistor U7 will be off. If internal complement node 210 is then discharged, PMOS transistor U7 will turn on while PMOS transistor U8 is still on to quickly pull internal true node 210 high. The high state for internal true node 210 will then propagate through inverters U5 and U6 to switch off PMOS transistor U8. At that point it is just PMOS transistor U1 that is keeping internal true node 210 charged. Since this transistor is relatively weak, the transition from high to low for internal true node 210 is relatively fast.

Consider the advantages of the resulting LUT construction. The use of NMOS pass transistors such as transistors 245, 246, 250, 251, 252, 253, 255, 260, M8, M9, M10, M11, M12, and M13 results in fewer transistors than an equivalent CMOS-based LUT design. Density is also enhanced because these NMOS pass transistors require fewer well spacing and well-tap restrictions. As compared to conventional NMOS-based LUTs such as LUT 100 discussed earlier, the NMOS-based LUT architecture disclosed herein need not use low-Vt NMOS transistors in its inverters such as inverters U5 and U6. There is no need for such low-Vt NMOS transistors because internal true node 210 can pass a strong one due to the cross coupling in PMOS transistors U1 and U1 as well as the feedback from feedback circuits such a feedback circuit 205A or 205B. The NMOS transistors (not illustrated) in inverters U5 and U6 thus have lower leakage current as compared to conventional NMOS-based LUT architectures such as LUT 100. In addition, the downstream voltage from the various NMOS pass transistors in the NMOS-based LUT architecture disclosed herein is limited to a threshold voltage drop below the supply voltage VCC. Since switching power (AC power) is proportional to the voltage swing times capacitance, the power consumption is reduced as compared to CMOS-based LUT architectures.

Figure 3:
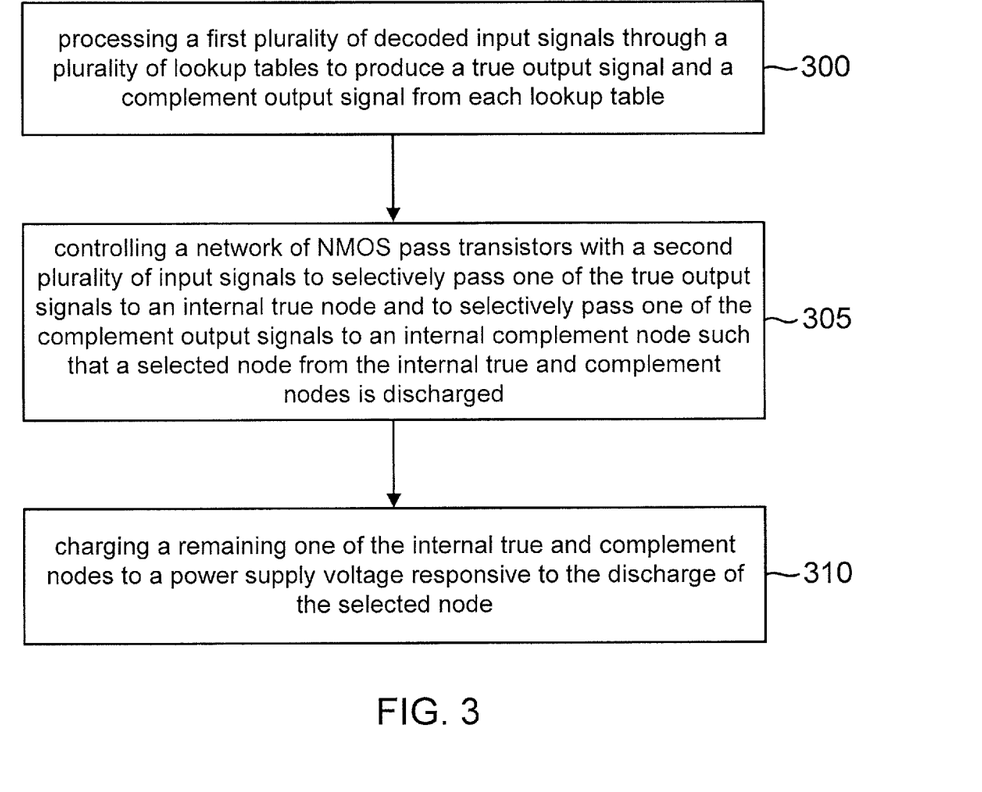
FIG. 3 is a flowchart for a method of operation for an NMOS-based LUT in accordance with an embodiment of the invention.

An example method of operation for an NMOS-based LUT in accordance with an embodiment of the disclosure will now be discussed with regard to FIG. 3. The method includes an act 300 of processing a first plurality of decoded input signals through a plurality of lookup tables to produce a true output signal and a complement output signal from each lookup table. The processing of decoded signals S(0:3) through the four four-bit LUTs of FIG. 2A is an example of act 300. The method further includes an act 305 of controlling a network of NMOS pass transistors with a second plurality of input signals to selectively pass one of the true output signals to an internal true node and to selectively pass one of the complement output signals to an internal complement node such that a selected node from the internal true and complement nodes is discharged. The operation of NMOS pass transistors M8, M9, M10, M11, M12, and M13 as discussed with regard to FIG. 2A is an example of act 305. Finally, the method includes an act 310 of charging a remaining one of the internal true and complement nodes to a power supply voltage responsive to the discharge of the selected node. The cross-coupling through cross-coupled PMOS U1 and U2 as discussed with regard to FIG. 2A is an example of act 310.

It will be appreciated that the techniques and concepts discussed herein are not limited to the specific disclosed embodiments. The appended claims encompass all such changes and modifications as fall within the true spirit and scope of this invention.

We claim:

1. A programmable logic device, comprising:
    a plurality of first lookup tables (LUTs) configured to form a larger lookup table, each first LUT having a true output node and a complement output node;
    a first plurality of NMOS pass transistors coupled between the true output nodes of the first LUTs and an internal true node;
    a second plurality of NMOS pass transistors coupled between the complement output nodes of the first LUTs and an internal complement node;
    a decoder configured to decode two input signals into four decoded signals, and wherein each lookup table is configured to ground one of its true and complement output nodes responsive to processing the four decoded signals; and
    a pair of PMOS transistors cross-coupled between the internal true node and the internal complement node and having their sources tied to a power supply node.

2. The programmable logic device of claim 1, further comprising:
    a feedback circuit coupled between the internal true node and a true output signal node, the feedback circuit being configured to charge the internal true node to a power supply voltage responsive to a discharge of the internal complement node.

3. The programmable logic device of claim 2, wherein the feedback circuit comprises a serial pair of inverters coupled between the internal true node and a true output node.

4. The programmable logic device of claim 3, wherein the feedback circuit further comprises a serial pair of feedback PMOS transistors coupled between the power supply node and the internal true node, and wherein a final inverter in the serial pair of inverters is configured to drive a gate of a first one of the feedback PMOS transistors.

5. The programmable logic device of claim 4, wherein the internal complement node is coupled to a gate of a remaining second one of the feedback PMOS transistors.

6. The programmable logic device of claim 5, wherein the second one of the feedback transistors has its source coupled to the power supply node and its drain coupled to a source of the first one of the feedback transistors, and wherein a drain of the first one of the feedback transistors is coupled to the internal true node.

7. The programmable logic device of claim 1, wherein the pair of PMOS transistors comprises:
    a first PMOS transistor having its drain coupled to the internal true node and its gate coupled to the internal complement node; and
    a second PMOS transistor having its drain coupled to the internal complement node and its gate coupled to the internal true node.

8. The programmable logic device of claim 1, wherein the plurality of first LUTs comprises four four-bit lookup tables.

9. The programmable logic device of claim 8, wherein the first plurality of NMOS pass transistors comprises a plurality of four first pass transistors corresponding to the four lookup tables, wherein two of the first pass transistors couple between the true output nodes of their corresponding lookup tables and a first intermediate true node, and wherein a remaining two of the first pass transistors couple between the true output nodes of their corresponding lookup tables and a second intermediate true node.

10. The programmable logic device of claim 9, wherein the first plurality of NMOS pass transistors further comprise a pair of second pass transistors, wherein a first one of the second pass transistors is coupled between the first intermediate true node and the internal true node, and wherein a remaining one of the second pass transistors is coupled between the second intermediate true node and the internal true node.

11. A method, comprising:
processing a first plurality of decoded input signals through a plurality of lookup tables to produce a true output signal and a complement output signal from each lookup table;
controlling a network of NMOS pass transistors with a second plurality of input signals to selectively pass one of the true output signals to an internal true node and to selectively pass one of the complement output signals to an internal complement node such that a selected node from the internal true and complement nodes is discharged; and
charging a remaining one of the internal true and complement nodes to a power supply voltage responsive to the discharge of the selected node, wherein processing the first plurality of decoded input signals through the plurality of lookup tables to produce the true output signal and the complement output signal from each lookup table comprises each lookup table discharging a selected one of its true output signal and its complement output signal while floating a remaining one of its true output signal and its complement output signal.

12. The method of claim 11, wherein charging the remaining one of the internal true and complement nodes comprises switching on a cross-coupled PMOS transistor having a gate coupled to the selected node and a drain coupled to the remaining one of the internal true and complement nodes.

13. The method of claim 12, wherein the selected node is the internal complement node, and wherein charging the internal true node further comprises switching on a first feedback PMOS transistor responsive to the discharge of the internal complement node to couple the internal true node to a power supply node supplying the power supply voltage.

14. The method of claim 13, wherein charging the internal true node further comprises switching off a second feedback PMOS transistor in series with the first feedback PMOS transistor responsive to the charging of the internal true node to the power supply voltage.

15. A programmable logic device, comprising:
a plurality of first lookup tables (LUTs) organized to form a larger lookup table, each first LUT having a true output node and a complement output node, wherein each first LUT is configured to process a plurality of decoded input signals to discharge a selected one of its true and complement output nodes while allowing a remaining one of its true and complement output nodes to float;
a first plurality of NMOS pass transistors coupled between the true output nodes of the first LUTs and an internal true node;
a second plurality of NMOS pass transistors coupled between the complement output nodes of the first LUTs and an internal complement node; and
a feedback circuit coupled between the internal true node and a true output signal node, the feedback circuit being configured to charge the internal true node to a power supply voltage responsive to a discharge of the internal complement node, wherein the feedback circuit comprises a serial pair of inverters coupled between the internal true node and a true output node, and a serial pair of feedback PMOS transistors coupled between the power supply node and the internal true node, and wherein a final inverter in the serial pair of inverters is configured to drive a gate of a first one of the feedback PMOS transistors.

16. The programmable logic device of claim 15, wherein the means comprises a pair of feedback PMOS transistors.

17. The programmable logic device of claim 15, wherein the plurality of first LUTs comprises four four-bit lookup tables.

18. The programmable logic device of claim 15, further comprising a pair of PMOS transistors cross-coupled between the internal true node and the internal complement node.

* * * * *